United States Patent [19]

Snodgrass et al.

[11] Patent Number: 5,537,030
[45] Date of Patent: Jul. 16, 1996

[54] VOLTAGE REGULATOR TEST SET FOR THE POWER DISTRIBUTION INDUSTRY

[75] Inventors: Douglas E. Snodgrass, Moberly; William L. Haffecke, Kirksville, both of Mo.

[73] Assignee: Union Electric Company, St. Louis, Mo.

[21] Appl. No.: 278,491

[22] Filed: Jul. 21, 1994

[51] Int. Cl.$^6$ .................................................. G01R 31/00
[52] U.S. Cl. ........................ 324/158.1; 324/771; 324/772; 324/73.1
[58] Field of Search ................................ 324/158.1, 772, 324/771, 73.1, 133

[56] References Cited

U.S. PATENT DOCUMENTS

| | | |
|---|---|---|
| 2,583,424 | 1/1952 | Haslett . |
| 2,632,794 | 3/1953 | Alexander . |
| 3,007,108 | 10/1961 | Sealey . |
| 3,058,062 | 10/1962 | Parmater et al. . |
| 3,239,755 | 3/1966 | Ehlschlager . |
| 3,356,939 | 12/1967 | Stevenson . |
| 3,492,571 | 1/1970 | Desler . |
| 3,549,996 | 12/1970 | Vaughan . |
| 3,581,205 | 5/1971 | Wilson . |
| 3,947,757 | 3/1976 | Grube et al. . |
| 4,112,748 | 9/1978 | Walley . |
| 4,222,005 | 9/1980 | Naito . |
| 4,241,306 | 12/1980 | Bump . |

OTHER PUBLICATIONS

Union Electric, "Substation Instruction Step Voltage Regulator Servicing", pp. 1–2, pre 1992.
Union Electric, "Attachment B1", one page, pre 1992.
General Electric Company, "Checking Regulator Controls and Control Settings", cover and p. 6, 1977.
Siemens–Allis, "Testing Regulator Windings", one page, Nov., 1978.

*Primary Examiner*—Kenneth A. Wieder
*Assistant Examiner*—Kourosh Cyrus Khosravi
*Attorney, Agent, or Firm*—Senniger, Powers, Leavitt & Roedel

[57] ABSTRACT

A portable test set for testing the voltage regulators used by utilities in the power distribution industry for regulating a voltage level of electrical power supplied over a transmission line comprises a first electrical lead adapted for connection to the source bushing on the regulator, a second electrical lead adapted for connection to the load bushing on the regulator, and a third electrical lead adapted for connection to the S/L bushing on the regulator. The test set also includes an electrical terminal adapted for connecting a voltage continuity tester between the second lead and the third lead, an electrical terminal adapted for connection to an alternating current source, and an electrical terminal adapted for connection to a voltmeter. A first switch circuit has a first operational state which selectively connects the terminal for the alternating current source to the first lead and a second operational state which selectively connects the terminal for the alternating current source to the second lead. A second switch circuit has a first operational state which selectively connects the terminal for the voltmeter to the first lead and a second operational state which selectively connects the terminal for the voltmeter to the second lead. Other versions of the portable test set are also disclosed.

18 Claims, 4 Drawing Sheets

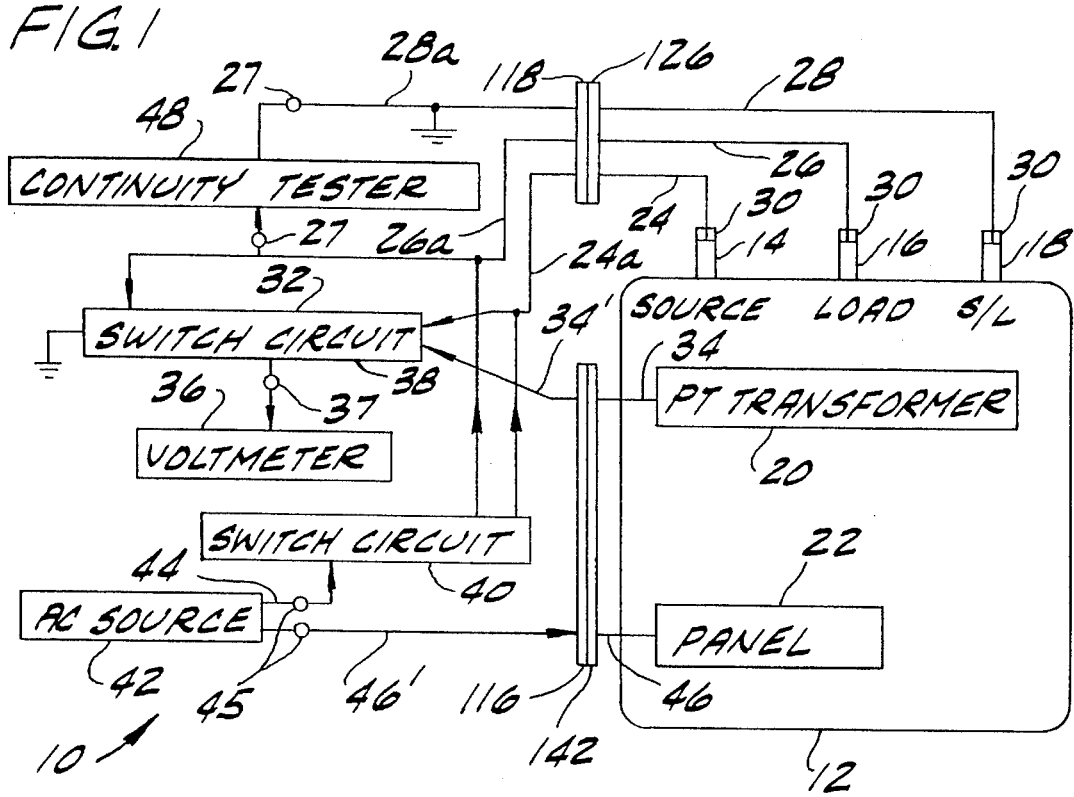
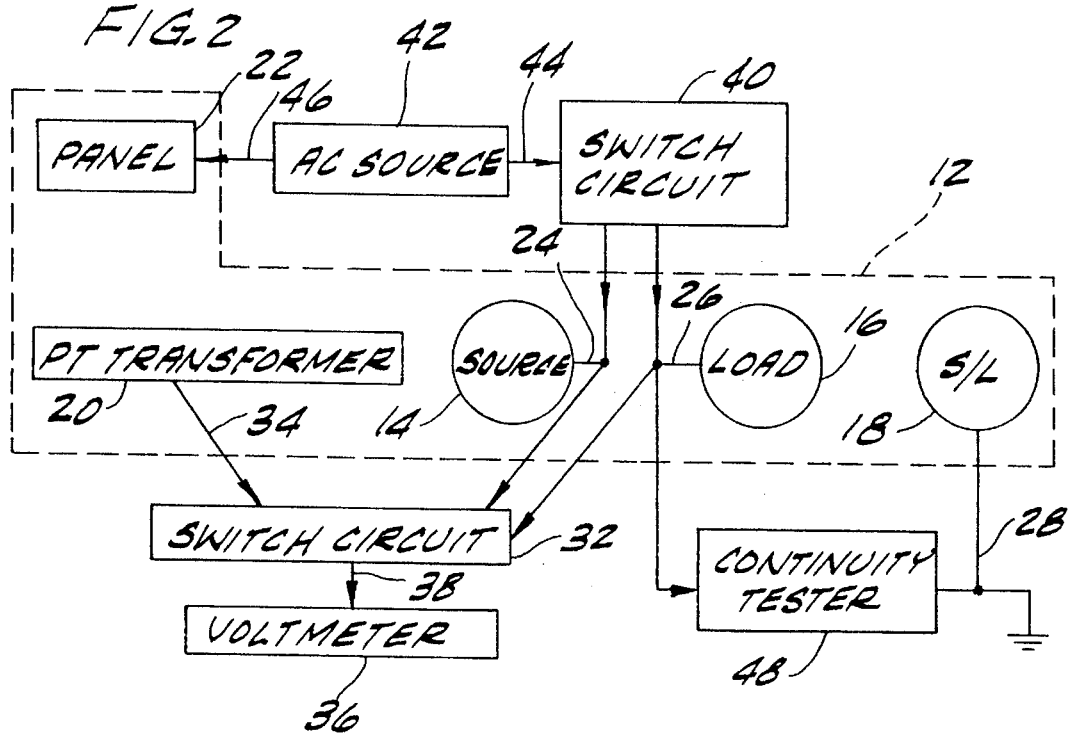

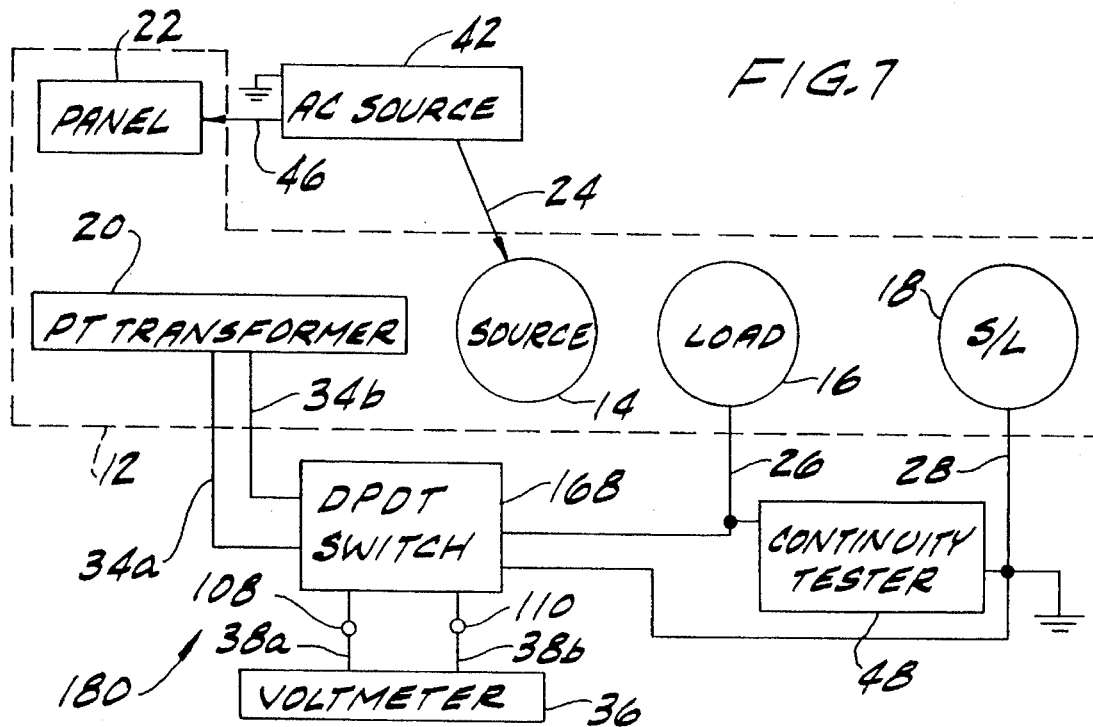
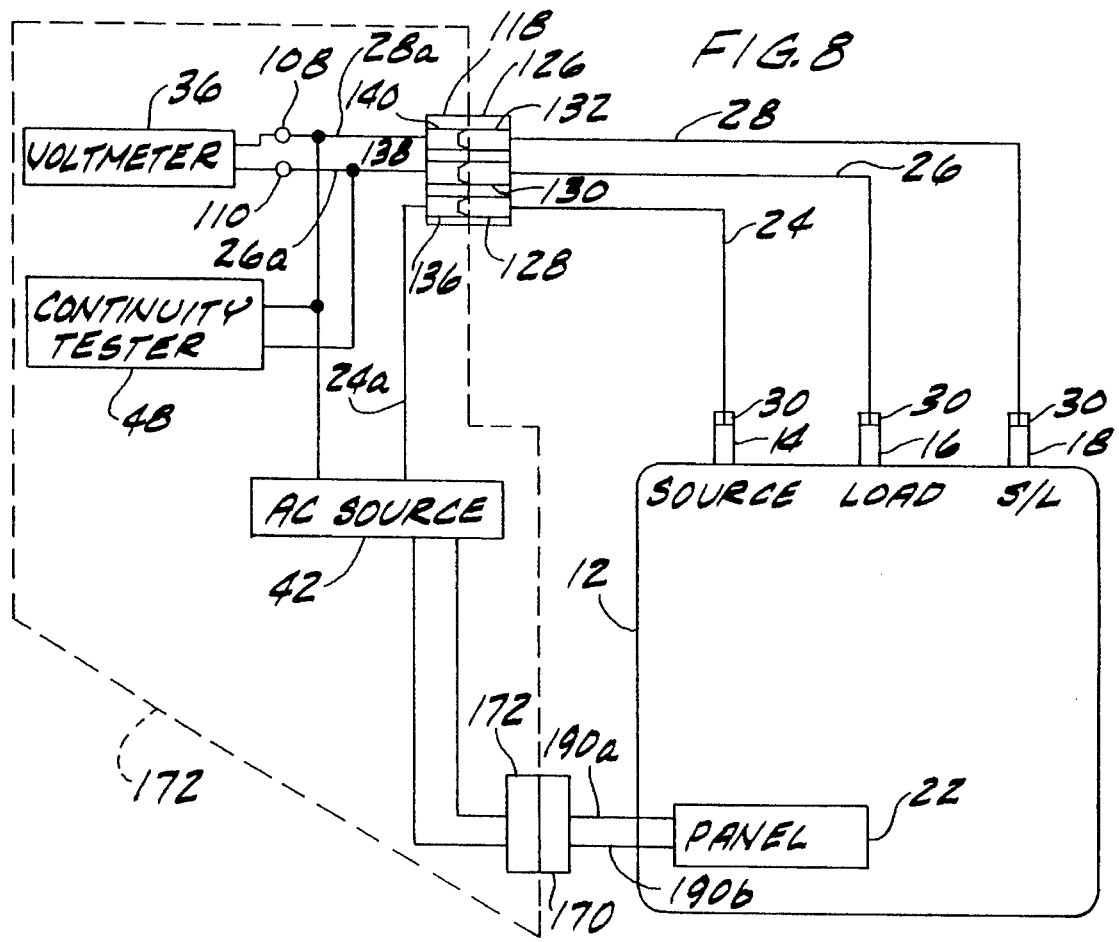

VOLTAGE REGULATOR TEST SET FOR THE POWER DISTRIBUTION INDUSTRY

BACKGROUND OF THE INVENTION

The power distribution industry uses a network of transmission lines to distribute electrical power to homes, businesses and industry. It is important that the electrical power be supplied continuously and at a stable voltage level. If the supply of power flickers and is not continuous, then consumers will see their lights flicker and other electrical equipment such as computers may malfunction. The voltage level must likewise be stable for the proper operation of electrical equipment.

A problem that utilities encounter comes from the changing electrical loads of their consumers. When large electrical equipment in a factory is turned on, for example, the increased electrical load will have the tendency to reduce the voltage level of the supplied power. Likewise, when the equipment is turned off, the decreased electrical load will tend to increase the voltage level of the supplied power. The same is true with large home appliances such as air conditioners, particularly when the air conditioners in adjacent homes are turned on in close proximity.

To compensate for the changing voltage levels caused by changes in electrical load, power companies install voltage regulators to raise the voltage level in response to an increase in load and to decrease the voltage level in response to a decrease in load. This is commonly accomplished within the voltage regulator by providing a number of taps on a circular path. A neutral tap leaves the voltage unchanged. A number of raise taps separately raise the voltage in fixed steps corresponding to each raise tap. A number of lower taps lower the voltage in fixed steps corresponding to each lower tap. An arctuate electrical contact is designed for contacting a particular tap to set the output voltage of the regulator. A motor drives the taps along the circular path in order to position the appropriate tap in electrical connection with the arcuate contact. During the transition from one tap to the next, the arctuate contact overlaps adjacent taps so that there is no discontinuity or flicker in the output voltage. A control circuit senses the output voltage with a potential transformer and then controls the motor to select the appropriate tap.

In use, voltage regulators must be tested to ensure that the effects of age, wear and corrosion do not cause flickers in the output voltage during tap changes and to ensure that the output voltage is being properly sensed by the potential transformer.

The present invention relates to a test set for testing the voltage regulators commonly used by utilities in power distribution systems. In particular, the test set tests the operation of a voltage regulator in raising and lower its load voltage and in sensing the load voltage with a potential transformer. Other tests can also be performed.

Conventional apparatus for testing a voltage regulator in the power industry includes a discrete voltmeter, source of electrical power, lamp and socket with jumpers for testing continuity, and multiple jumpers. During a test of the potential transformer within a voltage regulator, the power source is connected with jumpers across the load and S/L bushings. The voltmeter is also connected with jumpers across these bushings. The power source is adjusted until 120 volts are applied. The jumpers for the voltmeter are then connected to the terminals for the PT transformer and the voltage is read and divided into 120. The result is compared against the nameplate on the regulator. A functional test of the regulator is next performed by moving the jumpers to connect the power source across the source and S/L bushings. The jumpers for the voltmeter are also connected across these bushings. The power source is adjusted until the voltage reads 120 volts. The jumpers for the voltmeter are next connected to the load and S/L bushings. The reading should still be 120 volts. The lamp and socket are also connected across the load and S/L bushings to test for continuity. The regulator is then raised and lowered through its operating limits while the test operator monitors the step change in voltage for each raise/lower step and also monitors the output of the lamp for continuity. The jumpers are disconnected and the equipment is removed at the end of the test.

During the tests, several jumpers have to be moved from one contact point to the next which often creates a confusing jumble of wires and the possibility of serious mistake. Further, when the bushings for the regulator being tested are located at the top of a utility pole or in some other inconvenient location out of reach, a separate trip up and down a ladder is required each time a jumper(s) must be connected or moved in the course of the test. This is unnecessarily time consuming. The use of a lamp and socket for testing continuity has also been found to be unreliable and to require too much operator attention.

SUMMARY OF THE INVENTION

Among the objects of the present invention are to provide improved voltage regulator test sets which are reliable, durable and compact; to provide improved test sets which provide for the testing of a voltage regulator without the need for moving electrical jumpers from one contact point to the next during the test; to provide improved test sets which reliably and accurately detect discontinuities in the output voltage of a voltage regulator without undue operator attention; to provide improved test sets with dedicated electrical jumpers for avoiding confusion and mistake; and to provide improved test sets which are inexpensive to manufacture.

Generally, one aspect of the invention is an electrical system for regulating a voltage level of electrical power to be supplied by a utility. The electrical system includes a voltage regulator to regulate the voltage level of the electrical power. The voltage regulator has a source bushing, a load bushing and an S/L bushing. A first electrical lead connects to the source bushing, a second electrical lead connects to the load bushing, and a third electrical lead connects to the S/L bushing. An electrical terminal is provided for connecting a voltage continuity tester between the second lead and the third lead. Another electrical terminal connects to an alternating current source and another electrical terminal connects to a voltmeter. A first switch circuit is connected to the first lead, the second lead and the terminal for the alternating current source. The first switch circuit has a first operational state which selectively connects the terminal for the alternating current source to the first lead and has a second operational state which selectively connects the terminal for the alternating current source to the second lead. A second switch circuit is connected to the first lead, the second lead and the terminal for the voltmeter. The second switch circuit has a first operational state which selectively connects the terminal for the voltmeter to the first lead and has a second operational state which selectively connects the terminal for the voltmeter to the second lead.

Another aspect of the invention is a testing device for testing a voltage regulator used in a power distribution system. The voltage regulator regulates a voltage level of electrical power supplied over a transmission line and has a source bushing, a load bushing and an S/L bushing. The testing device includes a first electrical lead adapted for connection to the source bushing, a second electrical lead adapted for connection to the load bushing and a third electrical lead adapted for connection to the S/L bushing. An electrical terminal connects a voltage continuity tester between the second lead and the third lead. Another electrical terminal is adapted for connection to an alternating current source and another electrical terminal is adapted for connection to a voltmeter. A first switch circuit is connected to the first lead, the second lead and the terminal for the alternating current source. The first switch circuit has a first operational state which selectively connects the terminal for the alternating current source to the first lead and has a second operational state which selectively connects the terminal for the alternating current source to the second lead. A second switch circuit is connected to the first lead, the second lead and the terminal for the voltmeter. The second switch circuit has a first operational state which selectively connects the terminal for the voltmeter to the first lead and has a second operational state which selectively connects the terminal for the voltmeter to the second lead.

Still another aspect of the invention is a testing device for testing a voltage regulator used in a power distribution system. The voltage regulator regulates a voltage level of electrical power supplied over a transmission line and has a source bushing, a load bushing, an S/L bushing and a potential transformer for sensing the voltage appearing at the load bushing. The testing device includes a first electrical lead adapted for connection to the source bushing, a second electrical lead adapted for connection to the load bushing and a third electrical lead adapted for connection to the S/L bushing. A voltage continuity tester is connected between the second lead and the third lead. The testing device also includes an alternating current source and an electrical terminal adapted for connection to a voltmeter. A first switch circuit is connected to the first lead, the second lead and the alternating current source. The first switch circuit has a first operational state which selectively connects the alternating current source to the first lead and has a second operational state which selectively connects the alternating current source to the second lead. A second switch circuit is connected to the first lead, the second lead, the potential transformer and the electrical terminal. The second switch circuit has a first operational state which selectively connects the electrical terminal to the first lead, has a second operational state which selectively connects the electrical terminal to the second lead, and has a third operational state which selectively connects the electrical terminal to the potential transformer.

A still further aspect of the invention is a testing device for testing a voltage regulator used in a power distribution system. The voltage regulator regulates a voltage level of electrical power supplied over a transmission line and has a source bushing, a load bushing, an S/L bushing and a potential transformer for sensing the voltage appearing at the load bushing. The testing device includes a first electrical lead adapted for connection to the source bushing, a second electrical lead adapted for connection to the load bushing, and a third electrical lead adapted for connection to the S/L bushing. A voltage continuity tester is connected between the second lead and the third lead. An alternating current source is connected between the first lead and the third lead. The testing device also includes an electrical terminal adapted for connection to a voltmeter. A switch circuit is connected to the potential transformer, the second lead and the electrical terminal. The switch circuit has a first operational state which selectively connects the electrical terminal to the potential transformer and has a second operational state which selectively connects the electrical terminal to the second lead.

A yet further aspect of the invention is a portable testing device for testing a voltage regulator used in a power distribution system. The voltage regulator regulates a voltage level of electrical power supplied over a transmission line and has a source bushing, a load bushing and an S/L bushing. The testing device includes a keyed plug supporting first, second and third electrical conductors. A first electrical lead is adapted for connection to the source bushing at one end and is connected to the first conductor at the other end. A second electrical lead is adapted for connection to the load bushing at one end and is connected to the second conductor at the other end. A third electrical lead is adapted for connection to the S/L bushing at one end and is connected to the third conductor at the other end. A keyed receptacle releasably engages the keyed plug. The keyed receptacle supports first, second and third electrical contacts. A voltage continuity tester is connected between the second contact and the third contact and an alternating current source is connected between the first contact and the third contact. An electrical terminal is adapted for connecting a voltmeter between the second contact and the third contact.

Other objects and features will be in part apparent and in part pointed out hereinafter.

BRIEF DESCRIPTION OF THE DRAWINGS

FIG. 1 shows an electrical diagram for a voltage regulator test get.

FIG. 2 shows a simplified electrical diagram of that shown in FIG. 1.

FIG. 7 shows a electrical diagram for a voltage regulator test set.

FIG. 8 shows an electrical diagram for a voltage regulator test set.

Corresponding reference characters indicate corresponding parts throughout the several views of the drawings.

DETAILED DESCRIPTION OF PREFERRED EMBODIMENTS

Figure 3:
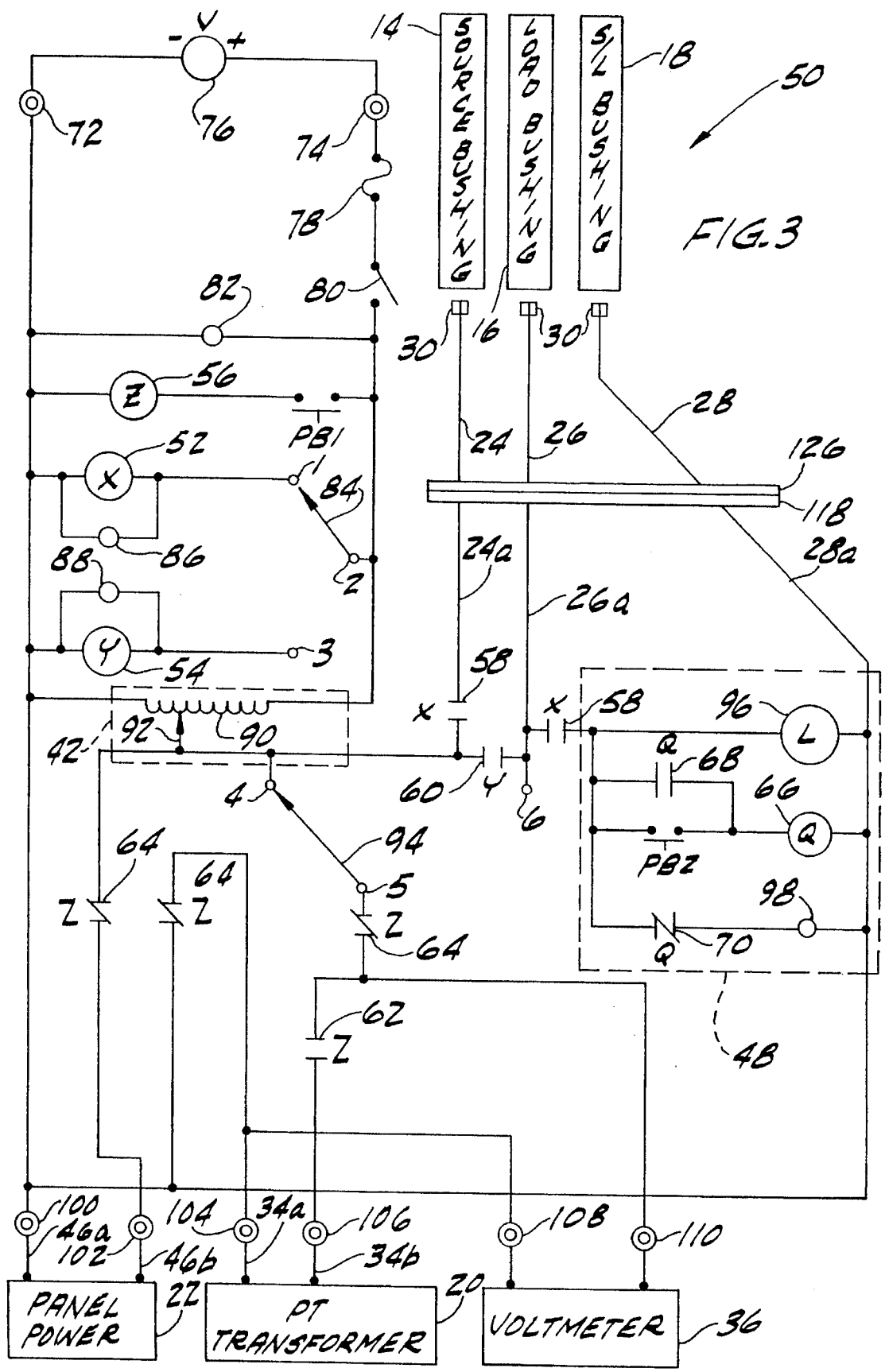
FIG. 3 shows a schematic diagram for a voltage regulator test set.

FIG. 1 shows a testing device generally indicated at reference numeral 10 connected for testing a voltage regulator 12. Voltage regulator 12 may be any of the commonly found voltage regulators used in the power distribution industry. Voltage regulator 12 includes a source bushing 14, a load bushing 16 and an S/L bushing 18. S/L bushing 18 is electrically grounded by testing device 10. Voltage regulator 12 includes a potential transformer or "PT transformer" 20 which is coupled between load bushing 16 and S/L bushing 18 for sensing the output voltage of regulator 12. Voltage regulator 12 also includes a panel 22 which includes control knobs, output jacks for outputting the voltage from PT transformer 20, and power input jacks for supplying power to voltage regulator 12 during a test.

Testing device 10 includes cables 24, 26 and 28 for connection to source bushing 14, load bushing 16 and S/L bushing 18, respectfully. Each of cables 24, 26 and 28 includes a connector 30 for mechanically connecting the cable to the appropriate bushing. Connector 30 may be a spring loaded clamp, alligator clip, or any other commonly found device for making connection between a cable and a bushing.

Testing device 10 also includes a switch circuit 32 which is connected to source bushing 14 and load bushing 16 via a receptacle 118 connected to a plug 126 and cables 24, 24a, 26 and 26a. Switch circuit 32 is connected to PT transformer 20 via lines 34 and 34' and a terminal such as a receptacle 116 and plug 142. Switch circuit 32 is also connected to a voltmeter 36 via a line 38 and jack (not shown). Line 38 includes a releasable electrical terminal 37 for disconnecting voltmeter 36 from circuit 10 if needed. In use, switch circuit 32 includes electrical contacts (not shown) for selectively connecting voltmeter 36 to alternately read out the voltage appearing at source bushing 14, load bushing 16 or PT transformer 20.

Testing device 10 also includes a switch circuit 40 which is connected to source bushing 14 and load bushing 16 via receptacle 118, plug 126 and cables 24, 24a, 26 and 26a. Switch circuit 40 is also connected to an AC source 42 via a line 44. AC source 42 is also connected to panel 22 via receptacle 116, plug 142 and lines 46 and 46' for supplying power to voltage regulator 12 during a test sequence. Lines 44 and 46' include releasable electrical terminals 45 for disconnecting AC source 42 from circuit 10 if needed. In use, switch circuit 40 includes electrical contacts (not shown) for selectively supplying power from AC source 42 to source bushing 14 or load bushing 16. Testing device 10 also includes a continuity tester 48 which is connected between load bushing 16 and S/L bushing 18 via lines 26a and 28a. Lines 26a and 28a include releasable electrical terminals 27 for disconnecting continuity tester 48 from circuit 10 if needed.

Accordingly, it is seen that switch circuit 32 is connected to lines 24 and 26, to PT transformer 20, and to terminal 37. Switch circuit 32 has a first operational state which selectively connects terminal 37 to line 24, a second operational state which selectively connects terminal 37 to line 26, and a third operational state which selectively connects terminal 37 to PT transformer 20. Further, switch circuit 40 is connected to lines 24 and 26 and to terminal 45. Switch circuit 40 has a first operational state which selectively connects terminal 45 to line 24 and a second operational state which selectively connects terminal 45 to line 26.

The electrical diagram shown in FIG. 2 is a simplified diagram of that shown in FIG. 1. The components appearing outside of dashed line 12 comprise testing device 10. The components falling within dashed line 12 comprise voltage regulator 12.

FIG. 3 shows the details of a testing device 50 which follows the general design of testing device 10 in FIGS. 1 and 2. Testing device 50 has been implemented with electrical relays, indicator lights, and push button switches. In particular, testing device 50 includes an X relay 52, a Y relay 54, and a Z relay 56. X relay 52 controls X contacts 58 which are open when X relay 52 is deenergized and which close when relay 52 is energized. Y relay 54 controls Y contacts 60 which are open when Y relay 54 is deenergized and which close when Y relay 54 is energized. Z relay 56 controls Z contacts 62 and Z contacts 64. Z contacts 62 are open when Z relay 56 is deenergized and are closed when Z relay 56 is energized. Z contacts 64 are closed when Z relay 56 is deenergized and are open when Z relay 56 is energized.

Testing device 50 also includes a Q relay 66 which controls Q contacts 68 and 70. Q contacts 68 are open when Q relay 66 is deenergized and are closed when Q relay 66 is energized. Q contacts 70 are closed when Q relay 66 is deenergized and are open when Q relay 66 is energized.

Testing device 50 includes cables 24, 26 and 28 for making connection via connectors 30 to source bushing 14, load bushing 16 and S/L bushing 18, respectively. Receptacle 118, plug 126 and lines 24a, 26a and 28a provide electrical connection from said cables to the circuitry of testing device 50.

Testing device 50 also includes connectors 72 and 74, which may be an ordinary power plug, for making connection to an external source of electrical power 76. Power source 76 may be a nominal 120 volt power source which is commonly available. Testing device 50 also includes a main power fuse 78 and a main power switch 80. When power switch 80 is closed, electrical power is supplied to testing device 50 for performing a test. When power switch 80 is open, power is shut off. An indicator light 82 indicates when power switch 80 is closed.

Testing device 50 also includes a push button switch PB1. When switch PB1 is depressed, Z relay 56 is energized. When switch PB1 is not depressed, Z relay 56 is deenergized. Testing device 50 also includes a switch 84 for selectively connecting a terminal 2 to a terminal 1 or to a terminal 3. When switch 84 makes connection between terminal 2 and terminal 1, X relay 52 is energized and an indicator light 86 emits light. When switch 84 selectively connects terminal 2 to terminal 3, Y relay 54 is energized and an indicator light 88 emits light. Testing device 50 also includes AC source 42. AC source 42 is preferably a three amp variac which includes a coil 90 and a moving arm member 92. Such a variac may be protected with a main power fuse 78 having a three amp rating. Moving arm member 92 is adjustable back and forth across coil 90 to vary the output voltage from said arm. Accordingly when switch 84 connects terminal 2 to terminal 1; the output voltage of AC source 42 is applied to source bushing 14. When switch 84 connects terminal 2 to terminal 3, the output voltage of AC source 42 is applied to load bushing 16.

Testing device 50 also includes a switch 94 for selectively connecting a terminal 5 to a terminal 4 or to a terminal 6. Switch 94 and switch PB1 are used for selectively connecting voltmeter 36 to source bushing 14, load bushing 16 or PT transformer 20.

Testing device 50 also includes a continuity tester within dashed line 48 of FIG. 3. Continuity tester 48 includes a lamp 96. Continuity tester 48 also includes Q relay 66, a push button switch PB2 and an alarm indicator 98 such as a lamp, audible alarm, or similar type device. In operation, when the continuity is being tested between load bushing 16 and S/L bushing 18, X relay 52 is energized via switch 84 which closes X contact 58. Power is therefore supplied from load bushing 16, through closed X contact 58, through lamp 96 and back to S/L bushing 18. Any disruption in the power supplied by load bushing 16 will appear as a flicker in the light output by lamp 96. Lamp 96 is preferably a low wattage lamp so that any flickers are easier to see with the naked eye.

Further, when the test begins, Q contact 70 will be closed so that alarm 98 will be energized. In order to reset alarm 98, switch PB2 is depressed one time which energizes Q relay 66. This closes Q contact 68 and opens Q contact 70. This turns off alarm 98 and holds Q relay 66 in a state of energization. Continuity tester 48 will remain in this condition with alarm 98 in a turned off state until the occurrence of a discontinuity in the power supplied by load bushing 16. If such a discontinuity in the powers occurs, Q relay 66 will lose energization, thereby opening Q contact 68 and closing Q contact 70. The closure of Q contact 70 will energize alarm 98 thus indicating that a discontinuity in the power supplied from load bushing 16 has occurred. Alarm 98 will continue to indicate such a discontinuity until the alarm circuit is reset by the test operator depressing switch PB2 another time. It will be seen, therefore, that the circuit for alarm 98 is connected in parallel and is redundant with lamp 96. This is preferable because it has been found that discontinuities in the power supplied by load bushing 16 will not be detected as easily with lamp 96 as they will be with the circuitry used for alarm 98. For example, alarm 98 as shown in FIG. 3 can detect a discontinuity having a duration of two cycles in a 60 Hz system. Those skilled in the art will recognize that many of the commonly found continuity testers could also be used in place of continuity tester 48 in FIG. 3 within the scope of the invention.

Testing device 50 also includes jacks 100 and 102 for making connection to power panel 22, jacks 104 and 106 for making connection to PT transformer 20, and jacks 108 and 110 for making connection to voltmeter 36. Jacks 100 through 106 may be incorporated into a keyed plug 142 and a keyed receptacle 120 as described below. Any suitable electrical terminal may be used for these jacks. The specifications for these jacks are not critical to the practice of the invention, so long as electrical connection is made. This may be accomplished with banana jacks, RCA connectors, receptacles, plugs, a screw and wire connection, or any of the other commonly found electrical connections.

Figure 4:
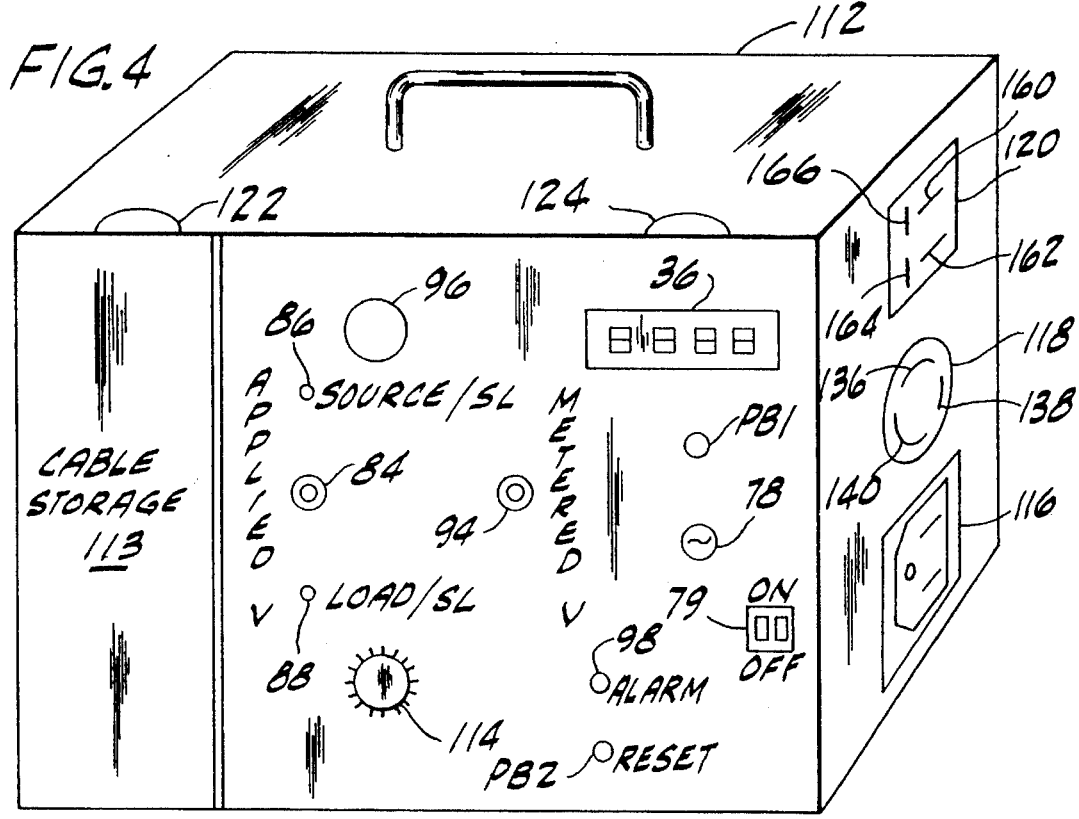
FIG. 4 shows a voltage regulator test set mounted in a portable carrying case.

FIG. 4 shows a carrying case 112 for mounting the electrical components of a testing device in a portable unit. Case 112 is particularly shown with the components of testing device 50 of FIG. 3, including a permanently mounted voltmeter 36. Case 112 can also be used with the other testing devices disclosed herein. Latch pieces 122 and 124 are used for connecting a cover (not shown) over the front of carrying case 112. Carrying case 112 includes an area labeled CABLE STORAGE 113 for storing all of the cables required to connect the circuitry in carrying case 112 to voltage regulator 12. The switches, lamps, meters and other electrical components shown on the face panel of carrying case 112 correspond to the electrical components in the testing device of FIG. 3. A knob 114 is provided for moving arm 92 with respect to coil 90 to thereby vary the voltage output by AC source 42. Receptacle 116 is provided on the side of carrying case 112 for making connection via cables to an electrical source of power, such as source 76 in FIG. 3o Receptacle 118 is provided for making connection via cables to source bushing 14, load bushing 16 and S/L bushing 18. Receptacle 120 is provided for making connection via cables to the panel power input 22 and the PT transformer 20. Each of the cables is labeled or color-coded to identify separately the load, source and S/L bushings and other components to which the particular cable should be connected.

In practice, relays 52, 54, 56 and 66 in FIG. 3 may be implemented with model number KUP11A1S relays by Potter and Brumfeld. These double pole, double throw enclosed relays have a 125 V coil. Receptacles 116, 118 and 120 are twist lock sockets to prevent an inadvertent disconnection during a test. Cables 24, 26 and 28 use 16 gauge conductors of appropriate length to position carrying case 112 at an appropriate location during the test. If the length of the cables is too great, heavier conductors may be needed. The same applies for the other connecting cables. Connectors 30 are standard 5 amp alligator clips or other suitable connectors. Voltmeter 36 is shown as a digital voltmeter. Those skilled in the art will recognize that an analog meter or any other circuit for testing and controlling the voltage required for a test of voltage regulator 12 may be used in place of voltmeter 36. Voltmeter 36 is preferably a 3.5 digit meter accurate to 1% VAC.

While the circuitry of FIG. 3 is shown as one embodiment of the electrical diagrams shown in FIGS. 1 and 2, those skilled in the art will recognize that these diagrams can also be implemented with transistors, switches, alarms and other commonly found electrical devices within the scope of the invention.

Figure 5:
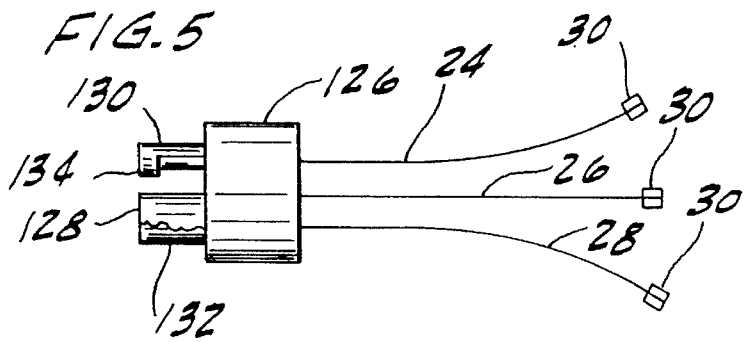
FIG. 5 shows a keyed plug and cables for connecting a voltage regulator test set to the bushings on a voltage regulator.

FIG. 5 shows a keyed plug-126 which supports electrical conductors 128, 130 and 132. Conductors 128, 130 and 132 are separately connected to cables 24, 26 and 28, respectively. Conductor 130 includes a commonly found engaging member 134 for releasably mechanically locking plug 126 into twisting engagement with a receptacle such as keyed receptacle 118 in FIG. 4. Receptacle 118 supports electrical contacts 136, 138 and 140 which, upon engagement with plug 126, are separately connected to conductors 128, 130 and 132, respectively. Conductor 130 and the opening in receptacle 118 for contact 138 are preferably larger than the other respective conductors and openings for keying plug 126 so that it will only engage receptacle 118 in the preferred orientation. Other well known methods of keying plug 126 and receptacle 118 to fix their orientation may also be employed within the scope of the invention. Contacts 136, 138 and 140 are connected to lines 24a, 26a and 28a for connection to the circuit components of testing device 10, testing device 50 or the test circuitry of FIGS. 2, 7 or 8, as the case may be.

Figure 6:
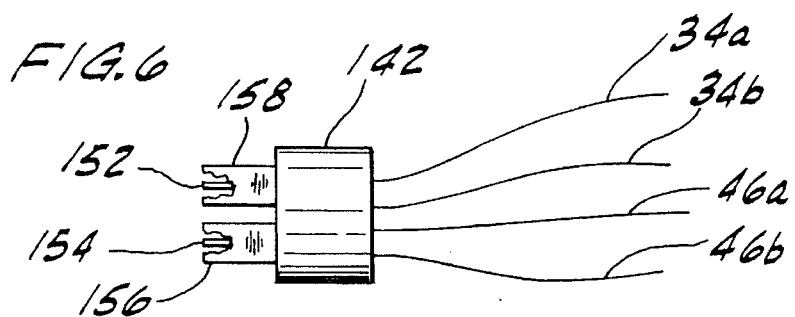
FIG. 6 shows a keyed plug and cables for connecting a voltage regulator test set to the potential transformer and panel power input of a voltage regulator.

FIG. 6 shows a keyed plug 142 which supports electrical conductors 152, 154, 156 and 158. Conductors 152, 154, 156 and 158 are separately connected to lines 34a, 34b, 46a and 46b, respectively. Receptacle 120 shown in FIG. 4 supports electrical contacts 160, 162, 164 and 166 which, upon engagement with plug 142, are separately connected to conductors 152, 154, 156 and 158, respectively. The physical orientation of said conductors and contacts within plug 142 and receptacle 120 fixes their orientation upon engagement. Other well known methods of keying plug 142 and receptacle 120 to fix their orientation may also be employed within the scope of the invention. Contacts 160, 162, 164 and 166 are connected to the corresponding lines for connection to the circuit components of testing device 10, testing device 50 or the test circuitry of FIGS. 2, 7 or 8, as the case may be.

The first test that can be performed on voltage regulator 12 with testing device 50 is a "potential transformer ratio test." To perform this test, the test operator places carrying case 112 next to the voltage regulator 12 and connects plugs 126 and 142 into receptacles 118 and 120, respectively. Standard 120 volt electrical power is also connected via receptacle 116. The test operator next connects cables 24, 26 and 28 to source bushing 14, load bushing 16 and S/L bushing 18, respectively. Lines 34a and 34b are connected to PT transformer 20 and lines 46a and 46b are connected to panel 22 for supplying electrical power to regulator 12 during the tests. Voltmeter 36 is connected via jacks 108 and 110 and suitable connectors. All of these connections require only one trip up and down a ladder.

In the next steps the regulator control panel power switch (not shown) on voltage tregulator 12 is moved to the "internal" position and the regulator set to the neutral tap where the voltage applied to source bushing 14 is equal to the voltage appearing at load bushing 16. Power switch 80 is turned on, switch 84 is moved to the position connecting terminal 2 to terminal 3, switch 94 is placed in position connecting terminal 5 to terminal 6 and arm member 92 is adjusted until the voltage read by voltmeter 36 is 120 volts. In this condition, 120 volts is applied to load bushing 16. Switch PB1 is now depressed which connects voltmeter 36 to PT transformer 20. The voltage on voltmeter 36 is read. The test operator will need to hold down switch PB1 until the voltage reading stabilizes. The PT transformer ratio is then calculated by dividing the voltage reading on voltmeter 36 into 120. The result of this division should be compared against the regulator name plate to verify the correct PT transformer ratio.

The next test to be performed tests the functional characteristics of voltage regulator 12. The test is designed to verify that the regulator can raise and lower the voltage output at load bushing 16 without any discontinuities in the supplied power. Discontinuities in the supplied power have been know to occur as a voltage regulator 12 changes taps to vary the output voltage. The test also tests to ensure proper percent of regulation per tap as indicated on the regulator nameplate and that the regulator limit switches are working properly.

To perform the functional test, all of the lines and cables are left in the same position as they were in during the PT transformer test. The regulator control power switch (not shown) is moved to the "external" position. Switch 84 is positioned connecting terminal 2 to terminal 1, switch 94 is positioned connecting terminal 5 to terminal 4, and arm member 92 is adjusted until the output of AC source 42 as measured by voltmeter 36 is 120 volts. Alarm 98 will be active at this time. Switch PB2 should be depressed one time to reset alarm 98.

With 120 volts now applied to source bushing 14, switch 94 is moved to connect terminal 5 to terminal 6. This allows the test operator to monitor the output voltage of voltage regulator 12 at load bushing 16. With voltage regulator 12 set on the neutral tap and 120 volts applied to source bushing 14, 120 volts should be measured at load bushing 16. The test operator now moves the regulator control switch (not shown) to the raise position. As voltage regulator 12 raises taps, the change in output voltage is monitored via voltmeter 36. If voltage regulator 12 is a ⅝ percent step regulator, the change between steps should be approximately 0.75 volts. The test operator monitors the voltage reading on voltmeter 36 after each change in taps to see that it is approximately 0.75 volts. Each tap is checked until voltage regulator 12 has moved through each of the 16 raise taps. After the 16th tap, the regulator limit switch (not shown) in voltage regulator 12 should prevent further operation of voltage regulator 12. The test operator also verifies that the voltage regulator 12 is at a maximum percentage raise i.e., if the regulator is plus or minus 10%, with 120 volts applied, the 16th raise should equate to 132 volts at the output of load bushing 16. The test operator now runs the voltage regulator 12 back down to the neutral position by moving the regulator control switch to the lower position. At the neutral position, the measured voltage should again be 120 volts. Further, switch 94 is moved to connect terminal 5 to terminal 4, and the test operator verifies that the test voltage applied at source bushing 14 is also 120 volts as applied at the beginning of the test. Of course, the test operator can verify that the applied voltage has not changed from 120 volts at anytime throughout the test by moving switch 94 to a position connecting terminal 5 to terminal 4 to monitor the 120 volts input and then back again to a position connecting terminal 5 to terminal 6 to continue the test. If a change in the voltage applied to source bushing 14 has occurred, it should be readjusted to 120 volts and, as the case may require, the test may need to be started over.

The same test for raising the regulator for the 16 taps is run again except that this time the voltage regulator 12 is lowered through the 16 lower taps. After voltage regulator 12 has moved through the 16 lowertaps, the limit switch should again stop the regulator and a minimum regulated voltage is checked. Again, the voltage is monitored to see that there is a change of about 0.75 volts per tap.

Throughout the functional tests during the tap changes, an "open" or defective tap is detected by continuity tester 48 of testing device 50. The reason is that an open or defective tap will cause a flicker in lamp 96 which may be detectable with the naked eye and, in the event, will cause alarm 98 to activate. Such discontinuity simulates the power supplied to a consumer whose lights would flicker as a result of such a discontinuity during service operation of voltage regulator 12. Such a discontinuity indicates that further maintenance work should be performed on voltage regulator 12.

Another use of testing device 50 is to calibrate the panel of voltage regulator 12 to ensure that the regulator has the proper bandwidth response to a change in output voltage. To perform this calibration after the above functional test, testing device 50 remains connected to voltage regulator 12. AC source 42 is adjusted until the nominal operating voltage for the power distribution system, such as 120 VAC, is applied to source bushing 14. For an operating bandwidth of 2 VAC and a nominal response time of 30 secs., the test operator next increases the voltage output by AC source 42 to a point just outside the bandwidth, i.e., slightly above 121 VAC. The test operator then measures the period of time which elapses before voltage regulator 12 adjusts to the lower tap. It should be about 30 secs. A similar test is performed to test the lower edge of the bandwith by adjusting AC source 42 from the nominal operating voltage (e.g. 120 VAC) until the voltage applied to source bushing 14 falls slightly below the bandwidth, i.e., slightly below 119 VAC. Again, the test operator measures the period of time which elapses before voltage regulator 12 responds by moving to a raise tap. It should be about 30 secs.

Other test parameters can also be used within the scope of the invention depending on the type of regulator being tested and desired operating characteristics. For example, the nominal line voltage may be 123 VAC with a 3 VAC bandwidth and a response time of 45 secs. In this case, the test operator tests the upper band by applying a voltage slightly above 124.5 VAC and tests the lower band by applying a voltage slight below 121.5 VAC. Measured response times should be about 45 secs. Other test parameters can also be used within the scope of the invention.

At the end of all tests, the test operator goes up and down the ladder only a second time to remove the lines and cables and to return regulator 12 to operating condition.

FIG. 7 shows an electrical diagram for an alternate testing device indicated generally by reference numeral 180. Testing device 180 also includes AC source 42 and is shown connected to voltage regulator 12. Testing device 180 is preferably mounted within a portable carrying case such as case 112 shown in FIG. 4. Testing device 180 includes a double pole, double throw switch 168. The poles of switch 168 are connected to voltmeter 36 via lines 38a and 38b. The contacts for the first throw of switch 168 are connected to PT transformer 20 via lines 34a and 34b. The contacts for the second throw of switch 168 are connected to load bushing 16 and S/L bushing 18 via lines 26 and 28. Accordingly, when switch 168 is thrown in the first direction, voltmeter 36 reads the voltage output by PT transformer 20. When switch 168 is thrown in the second direction, voltmeter 36 reads the voltage output at load bushing 16.

Accordingly, it is seen that switch 168 is connected to potential transformer 20, lines 26 and 28, and jacks 108 and 110. Switch 168 has a first operational state which selectively connects jacks 108 and 110 to potential transformer 20 and a second operational state which selectively connects jacks 108 and 110 to lines 26 and 28.

In use, testing device 180 can perform the potential transformer ratio test on voltage regulator 12. To perform this test, the regulator control panel power switch (not shown) on voltage regulator 12 must be moved to the "internal" position and the regulator set to the neutral tap where the voltage applied to source bushing 14 should equal the voltage appearing at load bushing 16. Cables 24, 26 and 28 are connected to source bushing 14, load bushing 16 and S/L bushing 18, respectively. Connection is also made to the panel power input 22 via line 46 and to PT transformer 20 via lines 34a and 34b. Voltmeter 36 is also connected via jacks 108 and 110. Switch 168 is thrown to connect voltmeter 36 to load bushing 16 and S/L bushing 18. AC source 42 is adjusted until the voltage read by voltmeter 36 is 120 volts. Switch 168 is now thrown to connect voltmeter 36 to PT transformer 20. After the reading on voltmeter 36 stabilizes, the reading is divided into 120 to calculate the PT transformer ratio. The result of this division should be compared against the regulator name plate to verify the correct PT transformer ratio.

The next test to be performed tests the functional characteristics of voltage regulator 12 in raising and lowering the voltage output at load bushing 16 without any discontinuities in the supplied power. The test also tests to ensure that the regulator limit switches are working properly.

To perform the functional test, the regulator control power switch (not shown) is moved to the "external" position. The cables remain in the positions originally connected during the PT test. Switch 168 is thrown to connect voltmeter 36 to load bushing 16 and S/L bushing 18. With regulator 12 set to the neutral tap where the voltage applied to source bushing 14 equals the voltage appearing at load bushing 16, AC source 42 is adjusted until the voltage read by voltmeter 36 is 120 volts.

With 120 volts now applied to source bushing 14, the test operator now moves the regulator control switch (not shown) to the raise position. As voltage regulator 12 raises taps, the change in output voltage is monitored via voltmeter 36. If voltage regulator 12 is a ⅝ percent step regulator, the change between steps should be approximately 0.75 volts. The test operator monitors the voltage output by voltmeter 36 after each change in taps to see that it is approximately 0.75 volts. Each tap is checked until voltage regulator 12 has moved through each of the 16 raise taps. After the 16th tap, the regulator limit switch (not shown) in voltage regulator 12 should prevent further operation of voltage regulator 12. The test operator also verifies that the voltage regulator 12 is at a maximum percentage raise i.e., if the regulator is plus or minus 10%, with 120 volts applied, the 16th raise should equate to 132 volts at the output of load bushing 16. The test operator now runs the voltage regulator 12 back down to the neutral position by moving the regulator control switch to the lower position. At the neutral position, the measured voltage should again be 120 volts. If a change in the voltage measured at load bushing 14 has occurred, AC source 42 should be readjusted to 120 volts and, as the case may require, the test may need to be started over.

The same test for raising the regulator for the 16 taps is run again except that this time the voltage regulator 12 is lowered through the 16 lower taps. After voltage regulator 12 has moved through the 16 lower taps, the limit switch should again stop the regulator and a minimum regulated voltage is checked. Again, the voltage is monitored to see that there is a change of about 0.75 volts per tap.

Throughout the functional tests during the tap changes, an "open" or defective tap is detected by continuity tester 48 of testing device 180. Tester 48 operates in the manner described above. At the end of the tests, the test operator goes up and down the ladder only a second time to remove the lines and cables and to return regulator 12 to operating condition.

Testing device 180 can also be used to calibrate the panel of voltage regulator 12 to ensure that the regulator has the proper bandwidth response to a change in output voltage. To perform this calibration after the above functional test, testing device 180 remains connected to voltage regulator 12. AC source 42 is adjusted until the nominal operating voltage for the power distribution system, such as 120 VAC, is applied to source bushing 14 as measured by voltmeter 36 with the regulator set to the neutral tap. For an operating bandwidth of 2 VAC and a nominal response time of 30 secs., the test operator next increases the voltage output by AC source 42 to a point just outside the bandwidth, i.e., slightly above 121 VAC. The test operator then measures the period of time which elapses before voltage regulator 12 adjusts to the lower tap. It should be about 30 secs. A similar test is performed to test the lower edge of the bandwith by adjusting AC source 42 from the nominal operating voltage (e.g. 120 VAC) until the voltage applied to source bushing 14 falls slightly below the bandwidth, i.e., slightly below 119 VAC. Again, the test operator measures the period of time which elapses before voltage regulator 12 responds by moving to a raise tap. It should be about 30 secs.

FIG. 8 shows another alternate testing device within dashed line 172 connected for testing voltage regulator 12. Testing device 172 is preferably mounted within a portable carrying case such as case 112 shown in FIG. 4. Testing device 172 is particularly suited for performing the functional and bandwidth tests on voltage regulator 12.

Testing device 172 includes voltmeter 36, continuity tester 48, and AC source 42 which are connected to cables 24, 26 and 28 via keyed plug 126 and keyed receptacle 118. Voltmeter 36 is thus connected between load bushing 16 and S/L bushing 18. Continuity tester 48 is also connected between load bushing 16 and S/L bushing 18. AC source 42 is connected between source bushing 14 and S/L bushing 18. AC source 42 is also connected for supplying power to panel 22 via a plug 170, a receptacle 172 and lines 190a and 190b.

In use, testing device 172 can perform the functional test on voltage regulator 12. To perform this test, the regulator control panel power switch (not shown) on voltage regulator 12 must be moved to the "external" position and the regulator set to the neutral tap where the voltage applied to source bushing 14 should equal the voltage appearing at load bushing 16. Cables 24, 26 and 28 are connected to source bushing 14, load bushing 16 and S/L bushing 18, respectively. Connection is also made to the panel power input 22 via lines 190a and 190b. Voltmeter 36 is also connected via jacks 108 and 110. AC source 42 is adjusted until the voltage read by voltmeter 36 is 120 volts.

With 120 volts now applied to source bushing 14, the test operator now moves the regulator control switch (not shown) to the raise position. As voltage regulator 12 raises taps, the change in output voltage is monitored via voltmeter 36. If voltage regulator 12 is a ⅝ percent step regulator, the change between steps should be approximately 0.75 volts. The test operator monitors the voltage output by voltmeter 36 after each change in taps to see that it is approximately 0.75 volts. Each tap is checked until voltage regulator 12 has moved through each of the 16 raise taps. After the 16th tap, the regulator limit switch (not shown) in voltage regulator 12 should prevent further operation of voltage regulator 12. The test operator also verifies that the voltage regulator 12 is at a maximum percentage raise i.e., if the regulator is plus or minus 10%, with 120 volts applied, the 16th raise should equate to 132 volts at the output of load bushing 16. The test operator now runs the voltage regulator 12 back down to the neutral position by moving the regulator control switch to the lower position. At the neutral position, the measured voltage should again be 120 volts. If a change in the voltage measured at load bushing 14 has occurred, AC source 42 should be readjusted to 120 volts and, as the case may require, the test may need to be started over.

The same test for raising the regulator for the 16 taps is run again except that this time the voltage regulator 12 is lowered through the 16 lowertaps. After voltage regulator 12 has moved through the 16 lowertaps, the limit switch should again stop the regulator and a minimum regulated voltage is checked. Again, the voltage is monitored to see that there is a change of about 0.75 volts per tap.

Throughout the functional tests during the tap changes, an "open" or defective tap is detected by continuity tester 48 of testing device 180. Continuity tester 48 operates in the manner described above.

Testing device 172 can also be used to calibrate the panel of voltage regulator 12 to ensure that the regulator has the proper bandwidth response to a change in output voltage. To perform this calibration after the above functional test, testing device 172 remains connected to voltage regulator 12. AC source 42 is adjusted until the nominal operating voltage for the power distribution system, such as 120 VAC, is applied to source bushing 14 as measured by voltmeter 36 with the regulator set to the neutral tap. For an operating bandwidth of 2 VAC and a nominal response time of 30 secs., the test operator next increases the voltage output by AC source 42 to a point just outside the bandwidth, i.e., slightly above 121 VAC. The test operator then measures the period of time which elapses before voltage regulator 12 adjusts to the lower tap. It should be about 30 secs. A similar test is performed to test the lower edge of the bandwith by adjusting AC source 42 from the nominal operating voltage (e.g. 120 VAC) until the voltage applied to source bushing 14 falls slightly below the bandwidth, i.e., slightly below 119 VAC. Again, the test operator measures the period of time which elapses before voltage regulator 12 responds by moving to a raise tap. It should be about 30 secs.

Those skilled in the art will recognize that different applied voltages may be used to conduct the above tests, different ratios may be found in the PT transformer of voltage regulators in the field, different step size changes may be found in the voltage regulators in the field, and different limits and other operating characteristics may also be found. In this event, the applied voltages, measured voltages, and expected output voltages are scaled appropriately, all as recognized by those skilled in the art. In addition, other terminals, jacks, plugs, receptacles, wires, cables, connectors, switches, relays and like hardware may be used with the circuits described herein to effectuate the connections and functions shown without departing from the scope of the invention.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. An electrical system for regulating a voltage level of electrical power to be supplied by a utility, the electrical system comprising:

a voltage regulator used in a power distribution system for regulating the voltage level of the electrical power, the voltage regulator having a source bushing, a load bushing and an S/L bushing;

a first electrical lead for electrical connection to the source bushing;

a second electrical lead for electrical connection to the load bushing;

a third electrical lead for electrical connection to the S/L bushing;

a first electrical terminal for electrically connecting a voltage continuity tester between the second lead and the third lead;

a second electrical terminal for electrical connection to an alternating current source;

a third electrical terminal for electrical connection to a voltmeter;

a first switch circuit connected to the first lead, the second lead and the second electrical terminal for the alternating current source; wherein the first switch circuit has a first operational state which selectively connects the second electrical terminal for the alternating current source to the first lead and wherein the first switch circuit has a second operational state which selectively connects the second electrical terminal for the alternating current source to the second lead; and a second switch circuit connected to the first lead, the second lead and the third electrical terminal for the voltmeter; wherein the second switch circuit has a first operational state which selectively connects the third electrical terminal for the voltmeter to the first lead and wherein the second switch circuit has a second operational state which selectively connects the third electrical terminal for the voltmeter to the second lead.

2. The electrical system of claim 1 comprising said voltage continuity tester connected to the first electrical terminal, an alternating current source connected to the second electrical terminal, and said voltmeter connected to the third electrical terminal.

3. A testing device for testing a voltage regulator used in a power distribution system, the voltage regulator for regulating a voltage level of electrical power supplied over a transmission line, the voltage regulator having a source bushing, a load bushing and an S/L bushing, the testing device comprising:

a first electrical lead for electrical connection to the source bushing;

a second electrical lead for electrical connection to the load bushing;

a third electrical lead for electrical connection to the S/L bushing;

a first electrical terminal for electrically connecting a voltage continuity tester between the second lead and the third lead;

a second electrical terminal for electrical connection to an alternating current source;

a third electrical terminal for electrical connection to a voltmeter;

a first switch circuit connected to the first lead, the second lead and the second electrical terminal for the alternating current source; wherein the first switch circuit has a first operational state which selectively connects the second electrical terminal for the alternating current source to the first lead and wherein the first switch circuit has a second operational state which selectively connects the second electrical terminal for the alternating current source to the second lead; and a second switch circuit connected to the first lead, the second lead and the third electrical terminal for the voltmeter; wherein the second switch circuit has a first operational state which selectively connects the third electrical terminal for the voltmeter to the first lead and wherein the second switch circuit has a second operational state which selectively connects the third electrical terminator the voltmeter to the second lead.

4. The testing device of claim 3 further comprising a fourth electrical lead for electrical connection to the voltage regulator to supply electrical power to the voltage regulator for powering the operation of the voltage regulator in raising and lowering the regulated voltage during the test.

5. The testing device of claim 3 comprising said alternating current source connected to the second electrical terminal.

6. The testing device of claim 3 comprising said voltmeter connected to the third electrical terminal.

7. The testing device of claim 3 comprising said voltage continuity tester connected to the first electrical terminal.

8. The testing device of claim 3 comprising said voltage continuity tester connected to the first electrical terminal, said continuity tester comprising:

a relay having a first and a second electrical contact and a relay coil for controlling said electrical contacts;

an electrical switch; and an alarm indicator;

wherein the relay coil is connected in series with the electrical switch between the second lead and the third lead;

wherein the first electrical contact is connected in parallel with the electrical switch; and wherein the second electrical contact is connected in series with the alarm indicator between the second lead and the third lead.

9. The testing device of claim 3 wherein the second switch circuit comprises a relay having a first operational state which selectively connects the third electrical terminal to the first lead and a second operational state which selectively connects the third electrical terminal to the second lead.

10. The testing device of claim 3 wherein the first switch circuit comprises a relay having a first operational state which selectively connects the second electrical terminal to the first lead and a second operational state which selectively connects the second electrical terminal to the second lead.

11. The testing device of claim 3 further comprising:

a fourth electrical terminal for electrical connection to a potential transformer in the voltage regulator;

wherein the second switch circuit is connected to the fourth electrical terminal; and wherein the second switch circuit has a third operational state which selectively connects the fourth electrical terminal to the third electrical terminal.

12. The testing device of claim 3 further comprising a portable chassis; wherein each of said electrical terminals and each of said switch circuits is mounted to the portable chassis.

13. A testing device for testing a voltage regulator used in a power distribution system, the voltage regulator for regulating a voltage level of electrical power supplied over a transmission line, the voltage regulator having a source bushing, a load bushing, an S/L bushing and a potential transformer for sensing the voltage appearing at the load bushing, the testing device comprising:

a first electrical lead for electrical connection to the source bushing;

a second electrical lead for electrical connection to the load bushing;

a third electrical lead for electrical connection to the S/L bushing;

a voltage continuity tester connected between the second lead and the third lead;

an alternating current source;

an electrical terminal for electrical connection to a voltmeter;

a first switch circuit connected to the first lead, the second lead and the alternating current source; wherein the first switch circuit has a first operational state which selectively connects the alternating current source to the first lead and wherein the first switch circuit has a second operational state which selectively connects the alternating current source to the second lead; and a second switch circuit connected to the first lead, the second lead, the potential transformer and the electrical terminal; wherein the second switch circuit has a first operational state which selectively connects the electrical terminal to the first lead; wherein the second switch circuit has a second operational state which selectively connects the electrical terminal to the second lead; and wherein the second switch circuit has a third operational state which selectively connects the electrical terminal to the potential transformer.

14. The testing device of claim 13 further comprising a fourth electrical lead for electrical connection to the voltage regulator to supply electrical power to the voltage regulator for powering the operation of the voltage regulator in raising and lowering the regulated voltage during the test.

15. The testing device of claim 13 wherein the alternating current source comprises a variable output alternating current source.

16. The testing device of claim 13 wherein the voltage continuity tester comprises:

a relay having a first and a second electrical contact and a relay coil for controlling said electrical contacts;

an electrical switch; and an alarm indicator;

wherein the relay coil is connected in series with the electrical switch between the second lead and the third lead;

wherein the first electrical contact is connected in parallel with the electrical switch; and wherein the second electrical contact is connected in series with the alarm indicator between the second lead and the third lead.

17. The testing device of claim 3 comprising:

a keyed plug supporting first, second and third electrical conductors;

wherein the first electrical lead is connected to the first conductor, the second electrical lead is connected to the second conductor, and the third electrical lead is connected to the third conductor; and a keyed receptacle for releasably engaging the keyed plug, the keyed receptacle supporting first, second and third electrical contacts;

wherein the first electrical terminal is connected between the second contact and the third contact, the second electrical terminal is connected between the first contact and the third contact, and the third electrical terminal is connected between the second contact and the third contact.

18. The testing device of claim 3 wherein the voltage regulator further comprises a potential transformer for sensing the voltage appearing at the load bushing and wherein said device further comprises:

a second keyed plug supporting fourth, fifth, sixth and seventh electrical conductors;

a fourth and fifth electrical leads for electrical connection to the voltage regulator at one end to supply electrical power to said regulator during a test and separately connected to the fourth and fifth conductors at the other end;

a sixth and seventh electrical leads for electrical connection to the potential transformer at one end to sense an output voltage of said transformer during a test and separately connected to the sixth and seventh conductors at the other end;

a second keyed receptacle for releasably engaging the second keyed plug, the second keyed receptacle supporting fourth, fifth, sixth and seventh electrical contacts;

a wire for connecting the fourth and fifth leads to the alternating current source, and an electrical switch for selectively connecting the sixth and seventh electrical contacts to the voltmeter.

* * * * *